(12) United States Patent
Klemmer

(10) Patent No.: US 7,265,625 B2
(45) Date of Patent: Sep. 4, 2007

(54) AMPLIFIER SYSTEMS WITH LOW-NOISE, CONSTANT-TRANSCONDUCTANCE BIAS GENERATORS

(75) Inventor: Nikolaus Klemmer, Cary, NC (US)

(73) Assignee: Analog Devices, Inc., Norwood, MA (US)

( * ) Notice: Subject to any disclaimer, the term of this patent is extended or adjusted under 35 U.S.C. 154(b) by 130 days.

(21) Appl. No.: 11/243,831

(22) Filed: Oct. 4, 2005

(65) Prior Publication Data

US 2007/0075778 A1   Apr. 5, 2007

(51) Int. Cl.
*H03F 3/45* (2006.01)
(52) U.S. Cl. .................................................. 330/261
(58) Field of Classification Search ............... 330/296, 330/261, 288
See application file for complete search history.

(56) References Cited

U.S. PATENT DOCUMENTS

| | | | | |
|---|---|---|---|---|
| 5,512,855 A | * | 4/1996 | Kimura | 327/538 |
| 5,777,518 A | | 7/1998 | Bailey | 330/296 |
| 5,973,524 A | | 10/1999 | Martin | 327/156 |
| 6,323,725 B1 | | 11/2001 | Goldblatt et al. | 327/543 |
| 6,407,623 B1 | | 6/2002 | Bazarjani et al. | 327/541 |
| 6,737,919 B2 | | 5/2004 | Cyrusian | 330/253 |
| 6,903,601 B1 | | 6/2005 | Aude | 327/541 |

OTHER PUBLICATIONS

Chen, Jiwei, "Novel Constant Transconductance References—with the Traditional Approach", 2003 IEEE SSMSD2003, Feb. 2003, pp. 104-107.
Nicolson, Sean, et al., "Improvements in Biasing and Compensation of CMOS Op Amps", 2004 IEEE, ISCAS 2004, May 2004, pp. I-665-I-668.
Carrillo, Juan M., et al., Input/Output Rail-to-Rail Op-Amp with Constant Behavior over the Entire Voltage Range, Integration, vol. 37, No. 1, Feb. 2004, 4 pages.

* cited by examiner

*Primary Examiner*—Robert Pascal
*Assistant Examiner*—Hieu Nguyen
(74) *Attorney, Agent, or Firm*—Koppel, Patrick, Heybl & Dawson

(57) ABSTRACT

Amplifier systems are provided with bias generators that substantially stabilize operating points of system parameters (e.g., drain current and transconductance) over PVT variations, substantially reduce body effects and Early effects, and substantially reduce system output noise. These advantages are realized without significantly increasing system size and/or power consumption.

20 Claims, 4 Drawing Sheets

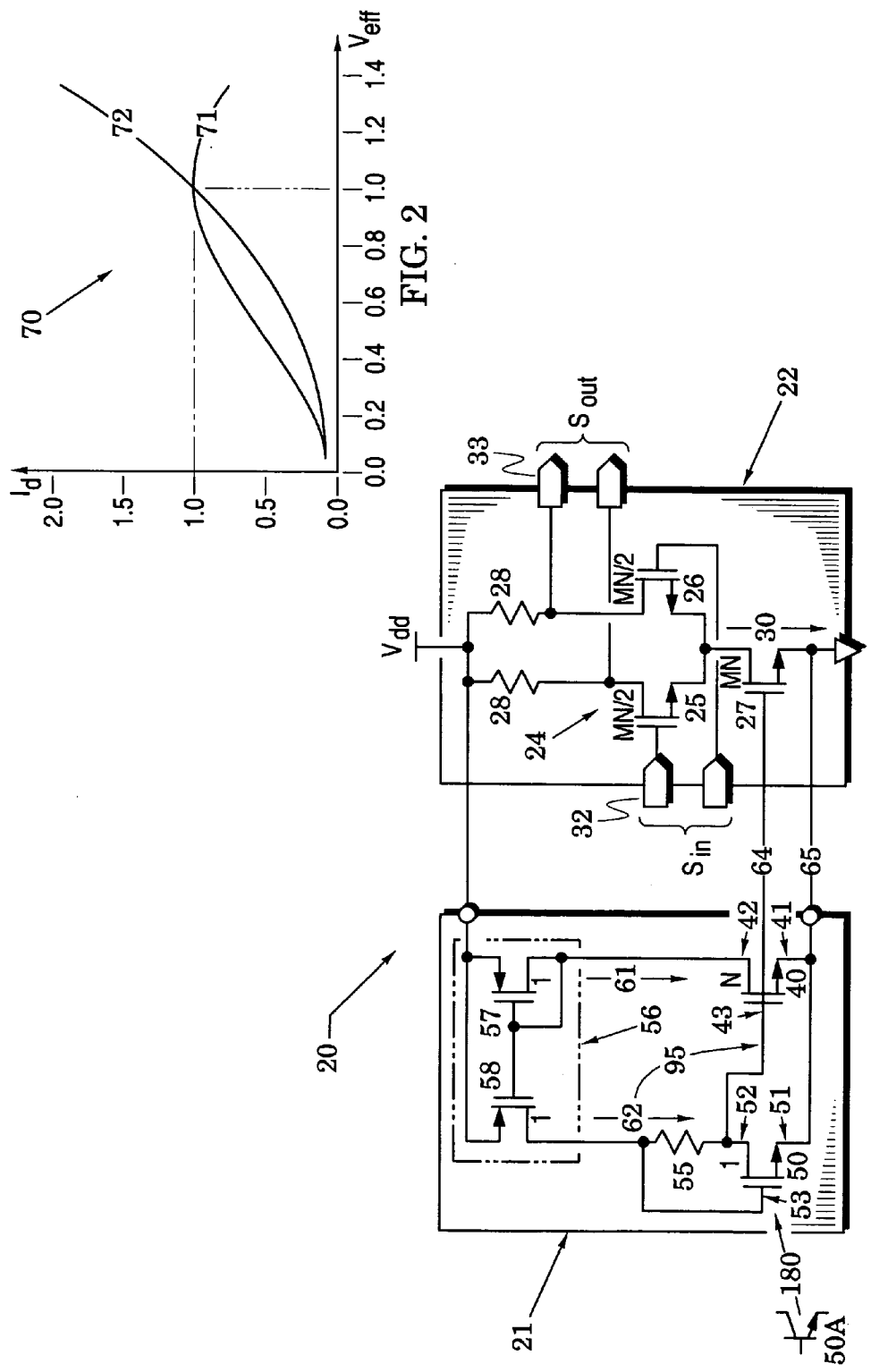

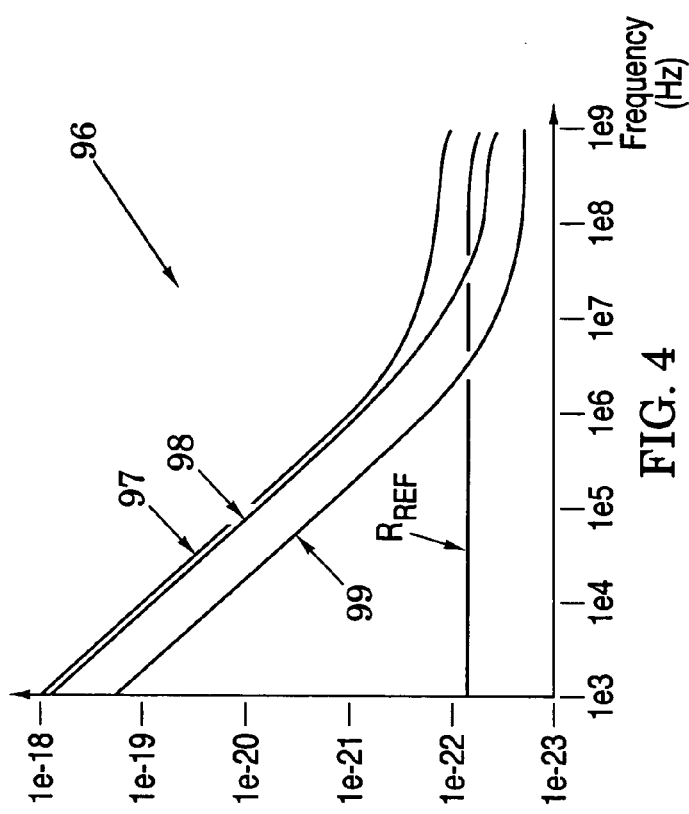
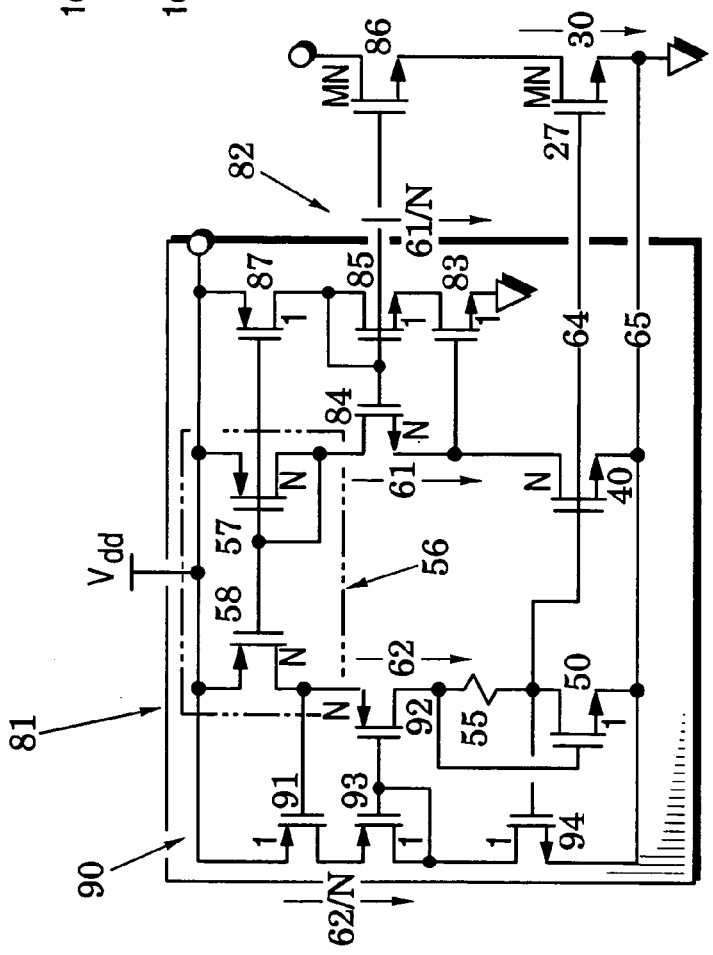
FIG. 4
FIG. 3

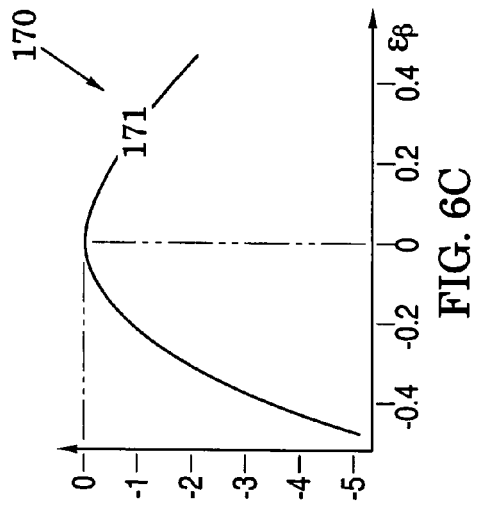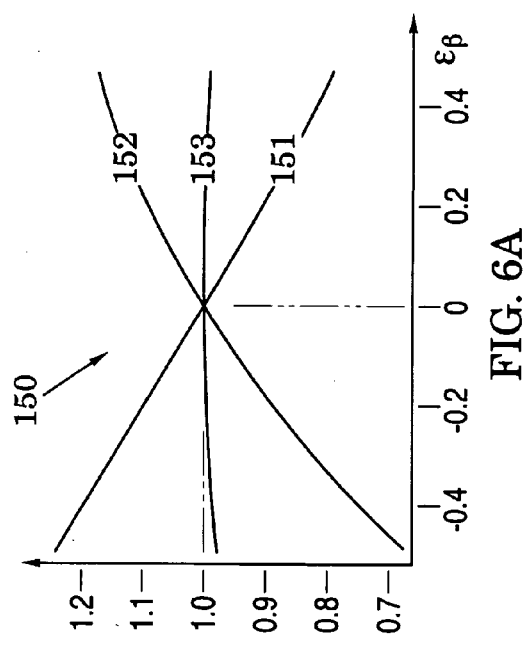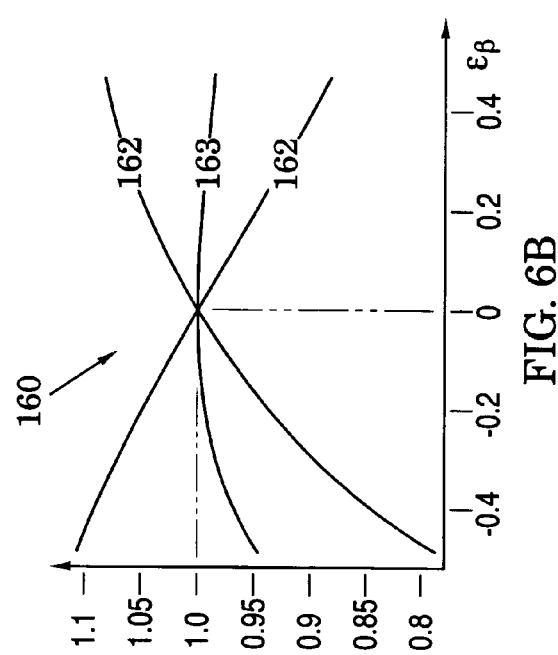
FIG. 6A
FIG. 6B
FIG. 6C

AMPLIFIER SYSTEMS WITH LOW-NOISE, CONSTANT-TRANSCONDUCTANCE BIAS GENERATORS

BACKGROUND OF THE INVENTION

1. Field of the Invention

The present invention relates generally to amplifier systems having bias signals provided by bias generators.

2. Description of the Related Art

A significant number of bias generators have been proposed for providing bias signals that enhance and/or stabilize transistor amplifier parameters (e.g., amplifier current, transconductance, voltage gain, and noise) in the presence of process, voltage supply and temperature (PVT) variations.

These generators have generally failed to effectively control at least one contributing source of error in amplifier performance. For example, several of these bias generators are configured so that an important metal-oxide-semiconductor (MOS) bias transistor has a body-to-source voltage $V_{BS}$ that differs from others of the bias transistors. This causes at least one bias transistor to exhibit a "body effect" which alters its threshold voltage $V_{TH}$ so that its drain current is no longer a reliable function of its gate-to-source voltage $V_{GS}$. Accordingly, significant errors are introduced into transistor parameters (e.g., transconductance).

In order to reduce these body-effect errors, some bias generators have emphasized the use of P-type transistors which can typically have their transistor bodies (i.e., wells) coupled to their sources. This, however, generally requires an associated amplifier of the system to also use P-type transistors which typically reduces the system's maximum operating frequency.

Conventional bias generators have also generally:
a) introduced bias errors by failing to address errors introduced by the Early effect,
b) failed to address the stabilization of transistor transconductances in systems that include a mix of P-type and N-type transistors,
c) ignored system noise performance with the result that it is often degraded, and/or
d) eliminated other problems at the cost of increased system size and/or system power consumption.

BRIEF SUMMARY OF THE INVENTION

The present invention is directed to amplifier system embodiments that include bias generators which improve system performance without significantly increasing system size and/or power consumption. The novel features of the invention are set forth with particularity in the appended claims. The invention will be best understood from the following description when read in conjunction with the accompanying drawings.

BRIEF DESCRIPTION OF THE DRAWINGS

FIG. 1 is a schematic of an amplifier system embodiment of the present invention that includes a low-noise, constant-transconductance bias generator;

FIG. 2 is a graph that illustrates current variations in the bias generator of FIG. 1;

FIG. 3 is a schematic of another embodiment of the system of FIG. 1;

FIG. 4 is a graph of output noise in the system of FIG. 3;

FIGS. 6A and 6B are graphs that illustrate transconductance variations in the system of FIG. 4 as a function of a relative β mismatch and FIG. 6C is a graph that plots transconductance error as a function of relative β mismatch.

DETAILED DESCRIPTION OF THE INVENTION

Figure 5:
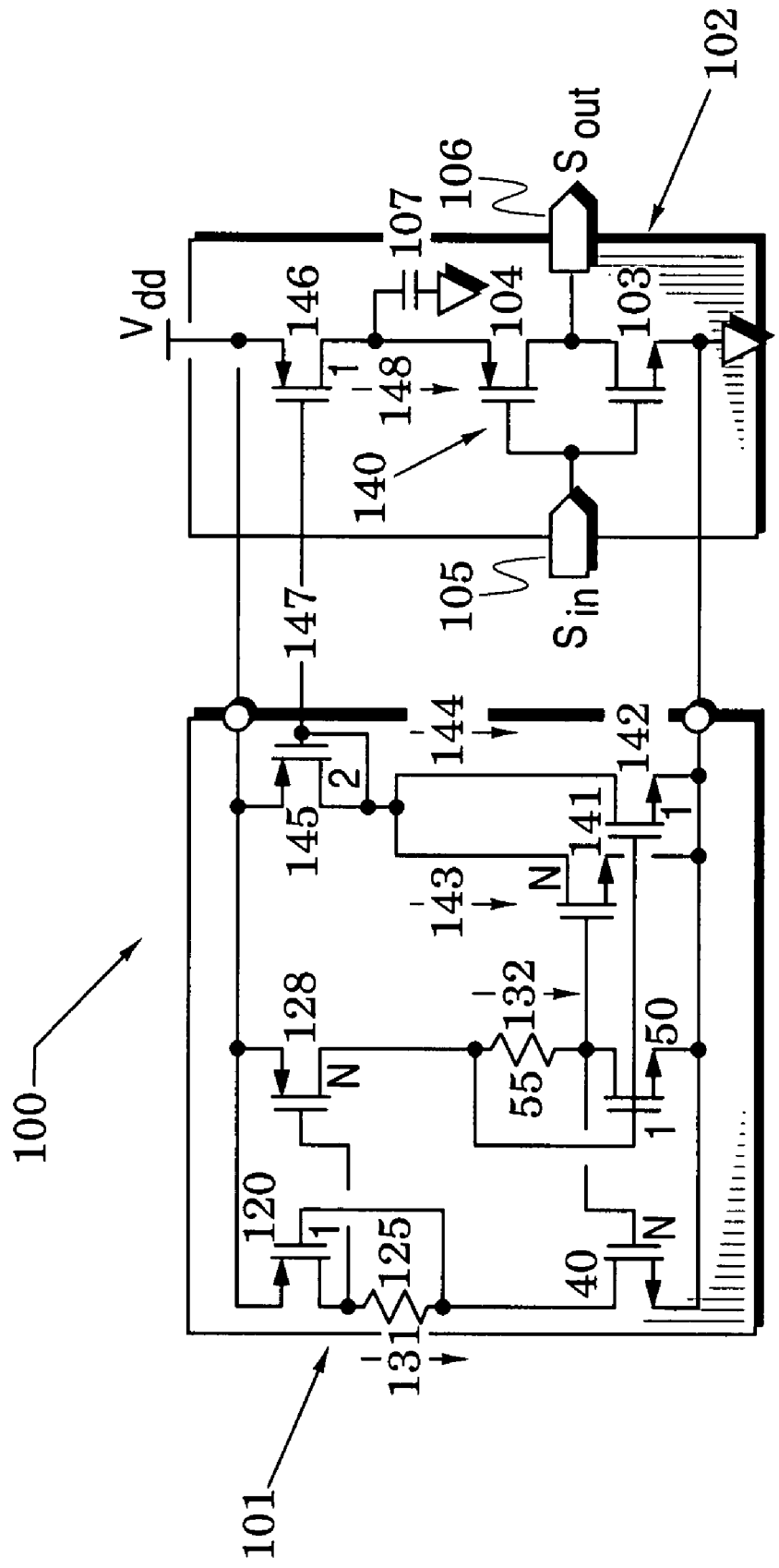
FIG. 5 is a schematic of another amplifier system embodiment that includes a low-noise, constant-transconductance bias generator.

FIGS. 1-6C illustrate amplifier system embodiments of the present invention that substantially stabilize operating points of system parameters (e.g., drain current and transconductance) over PVT variations, substantially reduce body effects and Early effects, and substantially reduce output noise. These advantages are realized without significantly increasing system size and/or power consumption.

In particular, FIG. 1 illustrates an amplifier system embodiment 20 that comprises a bias generator 21 and a differential amplifier 22. The amplifier 22 has a differential pair 24 of transistors 25 and 26, a current-source transistor 27 and resistors 28. The differential pair 24 is coupled to receive a tail current 30 from the current-source transistor 27 and to differentially steer the tail current across the resistors 28 in response to a differential input signal $S_{in}$ from an amplifier input port 32. Currents steered to the resistors 28 provide a corresponding output signal $S_{out}$ at an amplifier output port 33.

The bias generator embodiment 21 includes a bias transistor 40 that has first and second bias current terminals 41 and 42 that are responsive to a bias control terminal 43. It also includes a drive transistor 50 which has first and second drive current terminals 51 and 52 that are responsive to a drive control terminal 53. The bias generator 21 further includes a reference resistor 55 and a current mirror 56 which is formed with a diode-coupled transistor 57 and a current transistor 58 that is control-terminal coupled to the diode-coupled transistor 57.

In the embodiment of FIG. 1, the reference resistor 55 is coupled between the drive control terminal 53 and the second drive current terminal 52. The second drive current terminal 52 is then coupled to drive the bias control terminal 43. The current mirror 56 is arranged to mirror a first current 61 in the second bias terminal 42 to a second current 62 that is conducted through the reference resistor 55 to the second drive terminal 52. That is, the diode-coupled transistor 57 responds to the first current 61 by biasing the current transistor 58 to mirror the second current 62 and direct it through the reference resistor 55 to the second drive terminal 52.

In the bias generator embodiment 21, the bias transistor 40 is preferably scaled to be N times greater than the size of the drive transistor 50 as shown by the indicators N and 1 that are adjacent these transistors. This scaling is preferably realized with differences in gate widths W with gate lengths L left substantially equal. The current mirror 56 is a 1:1 current mirror so that the first and second currents 61 and 62 are forced to be substantially equal. Although the diode-coupled transistor 57 and the current transistor 58 are shown in FIG. 1 to have sizes equal to that of the drive transistor 50, they may have other sizes that still realize a 1:1 current mirror.

At this point, it is noted that the transistors in the system embodiment of FIG. 1 are metal-oxide-semiconductor transistors whose first and second current terminals are respectively sources and drains and whose control terminals are gates. In these transistors, an effective gate overdrive voltage $V_{EFF}$ is defined as the voltage by which the gate-to-source voltage $V_{GS}$ exceeds a transistor's threshold voltage $V_{TH}$ (i.e., $V_{EFF}=V_{GS}-V_{TH}$) which is the gate-to-source voltage at which its drain current begins to be generated.

In an important feature of the bias generator 21, it is arranged so that the bias control terminal 43 provides a bias signal 64 to the current-source transistor 21 of the differential amplifier 22 while the first bias current terminal 41 and first drive current terminal 51 are arranged to receive a common voltage potential 65 (e.g., ground).

Body effect causes transistors to have different threshold voltages so that their drain currents are altered even when their gate-to-source voltages have remained constant. Accordingly, body effect induces errors in the transconductance $g_m$ of the transistors. Because the first bias current terminal 41 and first drive current terminal 51 receive the same voltage potential, body effect errors are substantially eliminated.

Another important feature of the bias generator 21 is related to the input impedance of the diode-coupled transistor 50 and the resistance $R_{REF}$ of the reference resistor 55. If it is initially assumed that $R_{REF}$ is relatively small, then the drive transistor 50 is essentially a diode/coupled transistor with an input impedance of $1/g_m$. Variations $\Delta_I$ of the second current $I_{62}$ will therefore cause the voltage of the drive control terminal 53 to vary by $\Delta_I/g_m$.

Thus, the gate overdrive voltage $V_{EFF}$ of the drive transistor 50 will vary as $\Delta_I/g_m$ and, because the voltage of the bias control terminal 43 is $\Delta_I R_{REF}$ lower, it will vary as $\Delta_I/g_m - \Delta_I R_{REF}$ which can be rearranged as a net change of $\Delta_I(1/g_m - R_{REF})$. Therefore, the bias control terminal 43 (and, hence the first current 61) can be maintained substantially constant by selecting the resistance $R_{REF}$ in accordance with $$g_m = \frac{1}{R_{REF}}. \quad (1)$$

In the amplifier system embodiment of FIG. 1, it is assumed that the transconductance transfer function of all transistors is substantially parabolic and that the supply voltage $V_{dd}$ and transistor aspect ratios (i.e., the ratio W/L) are preferably chosen so that all transistors operate in their saturation region. Accordingly, it is known that the second current $I_{62}$ is $$I_{62} = \beta V_{EFF}^2 \quad (2)$$

in which the parameter $\beta$ is given by $$\beta = \frac{\mu C_{OX}}{2} \frac{W}{L} \quad (3)$$

wherein $\mu$ is a transistor's average channel electron mobility and $C_{OX}$ is its gate oxide capacitance per unit area.

Because the size of the bias transistor 40 is N times that of the drive transistor 50 and because there is a voltage drop of $I_{62}R_{REF}$ across the reference resistor 55, the first current $I_{61}$ is $$I_{61} = N\beta(V_{EFF} - I_{62}R_{REF})^2 \quad (4)$$

Because the current mirror 56 forces the first and second currents 61 and 62 to be equal, equations (2) and (4) reduce to $$V_{EFF} = \frac{I_{62}R_{REF}}{1 - \frac{1}{\sqrt{N}}}. \quad (5)$$

Replacing the second current $I_{62}$ with the relationship of equation (2) and rearranging the result yields $$V_{EFF} = \left(1 - \frac{1}{\sqrt{N}}\right)\frac{1}{\beta R_{REF}}. \quad (6)$$

It is apparent that transconductance $g_m$ is the derivative of equation (2) so that $g_m = 2\beta V_{EFF}$. Replacing $V_{EFF}$ in accordance with this relationship yields $$g_m = \frac{2}{R_{REF}}\left(1 - \frac{1}{\sqrt{N}}\right). \quad (7)$$

From equation (7), it is apparent that equation (1) can be realized by setting N=4. That is, the voltage of the drive control terminal 43 will be maintained substantially constant with variations in the second current 62 if the size of the bias transistor 40 is substantially 4 times that of the drive transistor 50. It is also apparent that transconductance will now be substantially constant independent of variations in device parameters and inversely proportional to the choice of the resistance $R_{REF}$. This resistance can then be independently chosen (e.g., chosen to improve the signal-to-noise ratio of the system 20 of FIG. 1 as will subsequently be described).

Attention is now directed to the graph 70 of FIG. 2 which includes a plot 72 of the second current 62 as the gate overdrive voltage $V_{EFF}$ of the drive transistor 50 is varied about an operating point—this plot 72 is thus a graphical expression of equation (2). The graph 70 also includes a plot 71 of the first current 61—this plot is a graphical expression of equation (4) when N is set equal to 4. It is apparent from the graph 70 that the first current 61 of FIG. 1 is controlled to be substantially constant and independent of PVT variations.

It is noted that the above discussion of amplifier embodiments was based on the assumption of parabolic device transfer functions. Amplifier embodiments based on other device transfer functions will lead to different values of N. For example, with bipolar exponential transfer functions $I_c = I_s \exp(V_{BE}/V_T)$ (in which $I_c$ is collector current, $I_s$ is a transfer constant, $V_{BE}$ is base-emitter voltage and $V_T$ is thermal voltage), the same features are obtained with N set substantially equal to the base e of natural logarithms (2.718 . . . ).

As shown in FIG. 1, the current-source transistor 27 can take on a size MN wherein M can be chosen to generate desired magnitudes of the output signal $S_{out}$ during operation of the amplifier 22. The sizes of the transistors 25 and 26 of the differential pair 24 are then preferably set to MN/2 so that their current density substantially equals that of the current-source transistor 27 when one half of the tail current 30 is steered through each of them by the differential input signal $S_{in}$.

FIG. 3 illustrates another bias generator embodiment 81 which includes elements of the bias generator 21 of FIG. 1 with like elements indicated by like reference numbers. In contrast to the embodiment 21, the bias generator 81 includes a feedback loop 82 that inserts a loop transistor 84 between the bias transistor 40 and the diode-coupled transistor 57. The loop also includes a loop transistor 83 that has a control terminal coupled to a junction between the bias transistor 40 and the loop transistor 84.

The loop further includes a diode-coupled transistor 85 that is arranged in series with the loop transistor 83 and includes a cascode transistor 86 that is arranged in cascode with the current-source transistor 27. The control terminals of the diode-coupled transistor 85 and the cascode transistor 86 are coupled to that of the loop transistor 84. Finally, a current transistor 87 is arranged to form a current mirror with the diode-coupled transistor 57 and mirror current to the diode-coupled transistor 85.

As indicated in FIG. 3, the size of the loop transistor 84 is substantially that of the bias transistor 40 while the sizes of the loop transistor 83 and diode-coupled transistor 85 are less by a factor of N. The size of the cascode transistor 86 is substantially that of the current-source transistor 27. The sizes of the transistors in the current mirror 56 have been increased by N and the size of the current transistor 87 is set substantially equal to that of the diode-coupled transistor 85 and the loop transistor 83.

Accordingly, the first and second currents $I_{61}$ and $I_{62}$ remain substantially equal but the current through the diode-coupled transistor 85 and the loop transistors 83 is reduced (shown as 61/N) from that of the first and second currents $I_{61}$ and $I_{62}$ by a factor of N. Therefore, the current densities of the loop transistors 83 and 84 and the diode-coupled transistor 85 substantially equal that of the bias transistor 40. Although the current 30 through the current-source transistor 27 and cascode transistor 86 exceeds the current 61 by a factor M, the current density of these transistors is also substantially equal to that of the bias transistor 40. It is thus important to note that all n-type transistors operate at the same current densities and all p-type transistors operate at the same current densities.

Therefore, all of the bias transistor 40, the loop transistors 83 and 84, the diode-coupled transistor 85, the current-source transistor 27 and the cascode transistor 86 have substantially the same $V_{GS}$. By inspection of FIG. 3, the $V_{DS}$ of the drive transistor 50 is the $V_{GS}$ of the bias transistor 40 and the $V_{GS}$ of the loop transistor 83 forces the bias transistor 40 to have a drain-to-source voltage ($V_{DS}$) substantially equal to its $V_{GS}$.

The $V_{DS}$ of the bias transistor 40 thus substantially matches that of the drive transistor and the bias transistor is biased into saturation by a margin substantially equal to its threshold voltage $V_{TH}$. Because the $V_{GS}$ of the loop transistor 84 substantially matches that of the diode-coupled transistor 85 and the cascode transistor 86, the loop transistor 83 and the current-source transistor 27 also have a $V_{DS}$ substantially equal to that of the drive transistor 50.

Because it forces the $V_{DS}$ of the bias transistor 40, the loop transistor 83, and the current-source transistor 27 to substantially equal that of the drive transistor 50, the feedback loop 82 stabilizes and equalizes the operating points of these transistors. For example, the output impedances of these transistors are finite but they are substantially equal. This elimination of drain-to-source voltage mismatch substantially reduces system degradation due to the Early effect.

The bias generator 81 also includes a feedback loop 90 that inserts a loop transistor 92 between the reference resistor 55 and the current transistor 58. This loop also includes a loop transistor 91 that has a control terminal coupled to a junction between the current transistor 58 and the loop transistor 92. This loop further includes a diode-coupled transistor 93 that is arranged in series with the loop transistor 91 with its control terminal coupled to that of the loop transistor 92. Finally, a current transistor 94 is arranged to form a current mirror with the bias transistor 40 and mirror current to the diode-coupled transistor 93.

As indicated in FIG. 3, the size of the loop transistor 92 is substantially that of the bias transistor 40 while the sizes of the loop transistor 91 and diode-coupled transistor 93 are less by a factor of N. The size of the current transistor 94 is set substantially equal to that of the loop transistor 91 and the diode-coupled transistor 93.

Accordingly, the current through the diode-coupled transistor 93 and the loop transistor 91 is reduced (shown as 62/N) from that of the first and second currents $I_{61}$ and $I_{62}$ by a factor of N. Therefore, the current densities of the loop transistors 91 and 92 and the diode-coupled transistor 93 substantially equal that of the remaining transistors of the bias generator 81.

Therefore, the loop transistors 91 and 92 and the diode-coupled transistor 93 have substantially the same $V_{GS}$ as the other transistors so that transistor 91 forces the current transistor 58 to have a $V_{DS}$ substantially equal to its $V_{GS}$ and substantially equal to the of the drive transistor 50. Because the $V_{GS}$ of the loop transistor 92 substantially matches that of the diode-coupled transistor 93, the loop transistor 91 has a $V_{DS}$ substantially equal to that of the drive transistor 50. Because it is diode-coupled, transistor 57 has a $V_{DS}$ substantially equal to its $V_{GS}$ and substantially equal to that of the drive transistor 50.

Because it forces the $V_{DS}$ of the current transistor 58, the loop transistor 93, and the diode-coupled transistor 57 to substantially equal that of the drive transistor 50, the feedback loop 92 stabilizes and equalizes the operating points of these transistors. For example, the output impedances of these transistors are finite but they are substantially equal. Again, the elimination of drain-to-source voltage mismatch substantially reduces system degradation due to the Early effect.

With reference to FIG. 1, it was noted above that variations $\Delta_I$ of the second current $I_{62}$ will cause the voltage of the drive control terminal 53 to vary by $\Delta_I/g_m$ but that the voltage of the bias control terminal 43 can be maintained substantially constant by selecting the resistance $R_{REF}$ to be 1/gm and setting the size N of the bias transistor 40 substantially equal to 4. Because the voltage of the bias control terminal 43 is substantially constant over PV variations (process and voltage supply variations), the first current 61 will also be substantially constant over PV variations.

That is, the voltage of the bias control terminal 43 is maintained substantially constant despite variations in the second current 62. In an important feature of the invention, therefore, the transfer function 95 from the second current $I_{62}$ to the bias control terminal 43 is substantially zero so that noise on the second current 62 is not transferred to the bias control terminal 43 and will not contribute to noise in the bias signal 64. The bias transistor 40 and the current mirror 56 do not, therefore, contribute to output noise because noise transfer along a feedback path through the current mirror 56 is substantially canceled.

Contributors to the noise in the output tail current 30 are thus limited to the thermal noise current of the drive transistor 50, noise voltage of the reference resistor 55, and output noise current of the current-source transistor 27. It has been found that the total signal-to-thermal noise ratio in the tail current 30 is given by $$\frac{4kT}{R_{REF}I_D^2}\left(4(1+\gamma)+\frac{2\gamma}{M}\right) \qquad (8)$$

in which k is Boltzman's constant, T is absolute temperature, γ is a transistor parameter that is principally determined by channel length, and M is the size of the current-source transistor 27.

In the case of flicker noise, only the drive transistor 50 contributes directly to noise at the bias control terminal 43. The noise of other potential contributors are canceled because the transfer function 95 in FIG. 1 is essentially zero. It has been found that, including flicker noise from the current-source transistor 27, the total output signal-to-flicker noise is $$\frac{K_{FN}}{C_{OX}(WL)}\frac{1}{R_{REF}^2}\frac{1}{f}\left(4+\frac{1}{M}\right) \qquad (9)$$

in which $K_{FN}$ is a transistor parameter that substantially describes the level of flicker noise power in the device, W and L are channel width and channel length of the drive transistor 50, and f is frequency.

The graph 96 of FIG. 4 shows a plot 97 of total noise, a plot 98 of the noise contribution of the drive transistor 50, a plot 99 of the noise contribution of the current-source transistor 27, and a plot marked "$R_{REF}$" which is the noise contribution of the reference resistor 55. The graph 96 shows results of a system simulation that employed circuit parameters of $V_{dd}$=1.8V, T=27° C., $I_{62}$=$I_{61}$=145 µA, $V_{EFF}$=0.21V, $W_N/L_N$=33/2 micron, $W_P/L_P$=11.4/0.8 micron, N=4, $R_{REF}$=1 kΩ, and $g_m$=1.0 mS. The graph 96 indicates a general improvement over conventional bias generators of approximately 4 dB in flicker noise and approximately 2.3 dB (γ=⅔) or 3.0 dB (γ=⅘) in thermal noise at the same current level.

FIG. 5 illustrates another amplifier system embodiment 100 which comprises a bias generator 101 and a complementary common-source amplifier 102. The amplifier 102 has transistors 103 and 104 with their control terminals (e.g., gates) coupled to receive an input signal $S_{in}$ from an amplifier input port 105 and their second current terminals (e.g., drains) coupled to provide an output signal $S_{out}$ at an amplifier output port 106. The first current terminal (e.g., source) of transistor 103 is coupled to ground and the first current terminal of transistor 104 is coupled through the low impedance (at a frequency of operation) of a capacitor 107 to ground.

The bias generator 101 includes a first drive transistor 50, a first reference resistor 55 that is coupled between a control terminal and a current terminal of the first drive transistor, a second drive transistor 120, and a second reference resistor 125 that is coupled between a control terminal and a current terminal of the second drive transistor. The generator also includes a bias transistor 40 that has a control terminal (e.g., gate) coupled to a current terminal (e.g., drain) of the first drive transistor 50 and has a current terminal (e.g., drain) coupled to pass a first bias current 131 through the second reference resistor 125. The generator further includes a current transistor 128 that has a control terminal (e.g., gate) coupled to the current terminal (e.g., drain) of the second drive transistor 125 and has a current terminal (e.g., drain) coupled to pass a second bias current 132 through the first reference resistor 55.

It is noted that the bias transistor 40, the first drive transistor 50 and the first reference resistor 55 were initially introduced in the system 20 of FIG. 1. It is further noted that the second drive transistor 120, the second reference resistor 125 and the current transistor 128 replace the current mirror 56 of FIG. 1. In the embodiment of FIG. 5, the first and second drive transistors 50 and 120 have first transistor sizes and the bias transistor 40 and the current transistor 128 have second transistor sizes that are substantially N times the first transistor sizes. It is important to note, however, different amplifier embodiments can be formed in which the N of the n-type devices differs from the N of the p-type devices.

Finally, the bias generator 101 includes a first mirror transistor 141 that is gate-coupled with the bias transistor 40 to thereby mirror a first mirrored current 143 and also includes a second mirror transistor 142 that is control-terminal coupled with the first drive transistor 50 to thereby mirror a second mirrored current 144. A third mirror transistor 145 has a current terminal that receives the first and second mirrored currents 143 and 144. A fourth mirror transistor 146 is then control-terminal coupled with the diode-coupled third mirror transistor 145 to thereby mirror an output bias current 148 through the transistors 103 and 104.

In the system embodiment of FIG. 5, the first mirror transistor 141 has a transistor size substantially that of the bias transistor 40, the second mirror transistor 142 has a transistor size substantially that of the first drive transistor 50, the third mirror transistor 145 has a transistor size substantially twice that of the second mirror transistor 142, and the fourth mirror transistor 146 has a transistor size substantially equal to that of the second mirror transistor 142.

The transistors 103 and 104 of the amplifier 102 are thus arranged to form a complementary common-source amplifier stage 140. They can also be considered to form a current-shared inverter in which the amplifier transistors 103 and 104 operate in accordance with equation (2) but with different respective values $\beta_N$ and $\beta_P$ which can each vary over respective ranges.

It is noted that the bias generator 101 is arranged so that the third mirror transistor 145 provides a mirror bias signal 147 to the amplifier 102 while current terminals (e.g., sources) of the bias transistor 40 and first drive transistor 50 are arranged to receive a first common voltage potential (e.g., ground) and current terminals (e.g., sources) of the current transistor 128 and second drive transistor 120 are arranged to receive a second common voltage potential (e.g., $V_{dd}$).

Given that the amplifier transistors 103 and 104 have respective transconductances $g_{mN}$ and $g_{mP}$, it is desired that the total transconductance $g_{mTOT}$ of the current-shared inverter be substantially constant over relative variations in the values of $\beta_N$ and $\beta_P$. Defining a relative β mismatch $\epsilon_\beta$ to be given by $\beta_P/\beta_N$=1+$\epsilon_\beta$, it then follows that the total transconductance $g_{mTOT}$ is $$g_{mTOT}=g_{mN}+g_{mP}=2\sqrt{\beta_N I_D}+2\sqrt{\beta_P I_D}+2\sqrt{\beta_N I_D}(1+\sqrt{1+\epsilon_\beta}) \quad (10)$$

wherein the substitution for transconductances $g_{mN}$ and $g_{mP}$ follows from the relationship $g_m=2\beta V_{REF}$ (that was previously noted) when combined with a substitution from equation (2).

It is apparent that the bias transistor 40 and the second drive transistor 120 are also current-shared transistors with insertion of the second reference resistor 125 (with a value $R_{ref}$). Similarly, the first drive transistor 50 and the current transistor 128 are current-shared transistors with insertion of the first reference resistor 55 (with a value $R_{ref}$). From equation (7), it can be seen that these current-shared transistors have a voltage transfer function given by $$g_{mTOT}R_{REF}=2\sqrt{\beta_N I_D R_{REF}}(1+\sqrt{1+\epsilon_\beta})=g_{mN}R_{REF}(1+\sqrt{1+\epsilon_\beta}) \quad (11)$$

(which reduces to $$g_{mTOT}R_{REF}=(1+\sqrt{1+\epsilon_\beta}) \quad (12)$$

when the transistor size N is set to 4.

From similarities to the structure of the bias generator 21 of FIG. 1 (and to equations (2) and (4)), it is follows that the currents 131 and 132 are given by $$I_{131} = N\beta_N\left(\sqrt{\frac{I_{132}}{\beta_N}} - I_{132}R_{REF}\right)^2 \text{ and } I_{132} = N\beta_P\left(\sqrt{\frac{I_{131}}{\beta_P}} - I_{131}R_{REF}\right)^2. \quad (13)$$

Solving these equations and substituting relative transconductance deviations $\gamma_N$ and $\gamma_P$ leads to $$1=(1-\gamma_N)[2-(1-\gamma_N^2)\sqrt{1+\epsilon_\beta}] \quad (14)$$

which expresses the relative transconductance deviation $\gamma_N$ as a function of the relative $\beta$ mismatch $\epsilon_\beta$. To first order, the solution of equation (11) is $\gamma_N \approx -\epsilon_\beta/2$. In addition, to first order, $I_2 \approx I_1(1+\epsilon_\beta)$ so that $\gamma_P \approx \epsilon_\beta 2$. The total transfer then is $$(g_{mN}+g_{mP})R_{REF}=(1+\gamma_N)+(1+\gamma_P)=2+O(\epsilon_\beta^2) \quad (15)$$

which is first order constant (O stands for "on the order of").

The exact normalized solutions for $g_{mP}$, $g_{mN}$, and $(g_{mP}+g_{mN})/2$ are shown as plots 151, 152 and 153 in the graph 150 of FIG. 6A (the total transconductance has been divided by 2 to normalize the graph). In an important feature of the invention, the total transconductance varies less than 4% in the range $0.5 \leq \beta_P/\beta_N \leq 1.5$ even as the individual transconductances vary up to 30%.

Because of the transistor sizings in FIG. 5, it is apparent that the mirrored current 143 substantially equals the first bias current 131, the mirrored current 144 substantially equals the second bias current 132, and the mirrored current 148 substantially equals ½ of the sum of the first and second bias currents 131 and 132. Therefore, from the above results $$I_{BIAS} = \frac{I_1 + I_2}{2} \quad (16)$$
$$= \frac{I_1 + (I_1 - 2\gamma_N)}{2}$$
$$= I_1(1-\gamma_N) \approx I_2(1+\gamma_N)$$

and, since $\gamma_N \approx -\epsilon_\beta/2$, the individual voltage transfers for the amplifier transistors 103 and 104 are $$g_{m103}R_{REF} = 2\sqrt{\beta_N I_{148}}\, R_{REF} \approx (1+\gamma_N)\sqrt{(1-\gamma_N)} \approx (1-\epsilon_\beta/4) \quad (17)$$

$$g_{m104}R_{REF} = 2\sqrt{\beta_P I_{148}}\, R_{REF} \approx (1+\gamma_N)\sqrt{(1-\gamma_N)(1+\epsilon_\beta)} \approx (1+\epsilon_\beta/4)$$

and the joint transconductance remains $$(g_{mN}+g_{mP})R_{REF}=2+O(\epsilon_\beta^2) \quad (18)$$

as found in equation (12).

The normalized transconductances for the amplifier transistors 103 and 104 and the current-shared amplifier transconductance are shown as plots 161, 162 and 163 in the graph 160 of FIG. 6B. As shown, the current-shared amplifier transconductance is substantially constant about an operating point whereas the individual transconductances vary up to 20%. Error in the current-shared amplifier transconductance is identified in plot 171 in the graph 170 of FIG. 6C.

Although amplifier system embodiments have been described above with reference to metal-oxide-semiconductor transistors, it is important to note that the teachings of these embodiments pertain to various transistor types. For example, they can be practiced with bipolar junction transistors. This substitution of transistors is exemplified in FIG. 1 where a bipolar junction transistor 50A is substituted for the drive transistor 50 by substitution arrow 180. The system embodiments shown in FIGS. 1-5C have generally been described with the assumption that metal-oxide-semiconductor transistors are operated in strong inversion. Embodiments may also be operated in weak-to-moderate inversion wherein the transistor size N (shown, for example, in FIG. 1) is suitably altered to a different value.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An electronic system that operates with a bias signal, comprising:
    a drive transistor;
    a resistor coupled between a control terminal and a current terminal of said drive transistor;
    a bias transistor that has a control terminal coupled to said current terminal of said drive transistor; and
    a current mirror arranged to mirror a first current in a current terminal of said bias transistor into a second current that is directed through said resistor to said current terminal of said drive transistor;
    said control terminal of said bias transistor thereby arranged to provide said bias signal and other current terminals of said drive and bias transistors thereby arranged to receive a common potential;
    and further including:
    a current transistor arranged to provide a mirrored current in response to said current mirror;
    a first loop transistor;

a second loop transistor inserted between said bias transistor and said current mirror with a control terminal of said first loop transistor coupled to said current terminal of said bias transistor; and a third loop transistor inserted to pass said mirrored current from said current transistor through said first loop transistor with control terminals of said second and third loop transistors coupled together.

2. The system of claim 1, further including:

a current-source transistor having a control terminal coupled to said control terminal of said bias transistor to thereby provide an output current; and a differential pair of transistors arranged to steer said output current between current terminals of said differential pair in response to a differential signal between control terminals of said differential pair.

3. An electronic system that operates with a bias signal, comprising:

a drive transistor;

a resistor coupled between a control terminal and a current terminal of said drive transistor;

a bias transistor that has a control terminal coupled to said current terminal of said drive transistor; and a current mirror arranged to mirror a first current in a current terminal of said bias transistor into a second current that is directed through said resistor to said current terminal of said drive transistor;

said control terminal of said bias transistor thereby arranged to provide said bias signal and other current terminals of said drive and bias transistors thereby arranged to receive a common potential;

and further including:

a current transistor arranged to provide a mirrored current in response to said bias transistor;

a first loop transistor;

a second loop transistor inserted between said resistor and said current mirror with a control terminal of said first loop transistor coupled to a junction between a current terminal of said second loop transistor and said current mirror; and a third loop transistor inserted to pass said mirrored current from said current transistor through said first loop transistor with control terminals of said second and third loop transistors coupled together.

4. The system of claim 3, wherein said drive transistor is configured to have a size that is N times greater than the size of said bias transistor.

5. The system of claim 4, wherein N is substantially 4.

6. The system of claim 4, wherein N is substantially the base e of natural logarithms.

7. The system of claim 3, wherein said current mirror is configured so that said first and second currents are substantially equal.

8. The system of claim 7, wherein said current mirror includes:

a diode-coupled transistor arranged to receive said first current; and a current transistor that provides said second current in response to said diode-coupled transistor.

9. The system of claim 3, further including a current-source transistor having a control terminal coupled to said control terminal of said bias transistor to thereby provide an output current.

10. An electronic system that operates with a bias signal, comprising:

a drive transistor;

a resistor coupled between a control terminal and a current terminal of said drive transistor;

a bias transistor that has a control terminal coupled to said current terminal of said drive transistor; and a current mirror arranged to mirror a first current in a current terminal of said bias transistor into a second current that is directed through said resistor to said current terminal of said drive transistor;

said control terminal of said bias transistor thereby arranged to provide said bias signal and other current terminals of said drive and bias transistors thereby arranged to receive a common potential;

further including a current-source transistor having a control terminal coupled to said control terminal of said bias transistor to thereby provide an output current;

and further including:

a cascode transistor arranged in cascode with said current-source transistor;

a current transistor arranged to provide a mirrored current in response to said current mirror;

a first loop transistor;

a second loop transistor inserted between said bias transistor and said current mirror with a control terminal of said first loop transistor coupled to said current terminal of said bias transistor; and a third loop transistor inserted to pass said mirrored current from said current transistor through said first loop transistor with control terminals of said cascode transistor and said second and third loop transistors coupled together.

11. An electronic system that operates with bias currents, comprising:

a first drive transistor;

a first resistor coupled between a control terminal and a current terminal of said first drive transistor;

a second drive transistor;

a second resistor coupled between a control terminal and a current terminal of said second drive transistor;

a bias transistor that has a control terminal coupled to said current terminal of said first drive transistor and has a current terminal coupled to pass a second bias current through said second resistor to said current terminal of said second drive transistor; and a current transistor that has a control terminal coupled to said current terminal of said second drive transistor and has a current terminal coupled to pass a first bias current through said first resistor to said current terminal of said first drive transistor;

other current terminals of said first drive transistor and said bias transistor thereby arranged to receive a first common potential and other current terminals of said second drive transistor and said current transistor thereby arranged to receive a second common potential.

12. The system of claim 11, wherein said first and second drive transistors are each configured to have a first size and said bias and current transistors are each configured to have a second size that is N times greater than said first size.

13. The system of claim 12, wherein N is substantially 4.

14. The system of claim 12, wherein N is substantially the base e of natural logarithms.

15. The system of claim 11, further including:

first mirror transistor control-terminal coupled with said first drive transistor to thereby mirror a first mirrored current;

a second mirror transistor control-terminal coupled with said bias transistor to thereby mirror a second mirrored current;

a third mirror transistor that has a current terminal arranged to carry said first and second mirrored currents; and a fourth mirror transistor that is control-terminal coupled with said third mirror transistor to mirror an output bias current.

16. The system of claim 15, further including first and second amplifier transistors arranged to carry said output bias current and to provide an output signal at coupled current terminals of said first and second amplifier transistors in response to an input signal at coupled control terminals of said first and second amplifier transistors.

17. An electronic system that operates with at least one bias signal, comprising:

a drive transistor that has a first size;

a resistor coupled between a control terminal and a current terminal of said drive transistor;

a bias transistor that has a second size which is N times said first size and that has a control terminal coupled to said current terminal of said drive transistor; and a current mirror arranged to mirror a first current in a current terminal of said bias transistor into a second current that is directed through said resistor to said current terminal of said drive transistor;

said control terminal of said bias transistor and said control terminal of said drive transistor thereby arranged to provide bias signals and other current terminals of said drive and bias transistors thereby arranged to receive a common potential;

wherein said current mirror includes:

a second drive transistor;

a second resistor inserted between a control terminal and a current terminal of said second drive transistor with said control terminal of said second drive transistor coupled to said current terminal of said bias transistor; and a current transistor that has a control terminal coupled to said current terminal of said second drive transistor and has a current terminal coupled to said control terminal of said drive transistor.

18. The system of claim 17, further including:

first and second amplifier transistors arranged to carry an output bias current and to provide an output signal at coupled current terminals of said first and second amplifier transistors in response to an input signal at coupled control terminals of said first and second amplifier transistors; and a second current mirror coupled to mirror said output bias current to said first and second amplifier transistors in response to control terminals of said drive and bias transistors.

19. The system of claim 18, wherein said current mirror is configured to cause said output bias current to be substantially one half of the sum of said first and second currents.

20. The system of claim 17, wherein:

said second drive transistor has a size substantially that of said drive transistor; and said current transistor has a size substantially that of said bias transistor.

* * * * *